United States Patent [19]

Chow et al.

[11] Patent Number: 4,464,458

[45] Date of Patent: Aug. 7, 1984

[54] PROCESS FOR FORMING RESIST MASKS UTILIZING O-QUINONE DIAZIDE AND PYRENE

[75] Inventors: Ming-Fea Chow, Poughquag, N.Y.; Edward C. Fredericks, Haymarket, Va.; Wayne M. Moreau, Wappingers Falls, N.Y.

[73] Assignee: International Business Machines Corporation, Armonk, N.Y.

[21] Appl. No.: 454,766

[22] Filed: Dec. 30, 1982

[51] Int. Cl.³ .............................................. G03F 7/26
[52] U.S. Cl. ................................... 430/312; 430/156; 430/171; 430/165; 430/166; 430/191; 430/193; 430/311; 430/330; 430/326; 430/323
[58] Field of Search ............. 430/166, 165, 312, 311, 430/191, 193, 189, 156, 171, 330, 326, 323

[56] References Cited

U.S. PATENT DOCUMENTS

| | | | |
|---|---|---|---|
| 2,937,085 | 5/1960 | Seven et al. | 96/33 |
| 3,085,008 | 4/1963 | Case | 96/75 |
| 3,317,320 | 5/1967 | Reber | 96/36.2 |
| 3,380,825 | 4/1968 | Webers | 96/35.1 |
| 3,482,977 | 12/1969 | Baker | 96/36.2 |
| 3,486,900 | 12/1969 | Tsunoda et al. | 430/171 |
| 3,518,084 | 6/1970 | Barson et al. | 96/36.2 |
| 3,549,368 | 12/1970 | Collins et al. | 96/35.1 |
| 3,567,453 | 3/1971 | Borden | 430/189 |
| 3,591,378 | 7/1971 | Altman | 96/35.1 |
| 3,634,082 | 1/1972 | Christensen | 96/33 |
| 3,716,390 | 2/1973 | Garbarini | 117/34 |
| 3,827,908 | 8/1974 | Johnson, Jr. et al. | 117/201 |
| 3,873,313 | 3/1975 | Horst et al. | 96/36 |
| 3,955,981 | 5/1976 | Stachniak | 96/36.1 |
| 3,982,943 | 10/1976 | Feng et al. | 96/38.4 |
| 4,009,033 | 2/1977 | Bakos et al. | 96/33 |
| 4,036,644 | 7/1977 | Kaplan et al. | 96/36 |
| 4,088,490 | 5/1978 | Duke et al. | 96/36.2 |
| 4,212,935 | 7/1980 | Canavello et al. | 430/191 |
| 4,237,216 | 12/1980 | Skarvinko | 430/280 |
| 4,256,829 | 3/1981 | Daniel | 430/312 |
| 4,296,194 | 10/1981 | Harper et al. | 430/191 |
| 4,352,870 | 10/1982 | Howard et al. | 430/166 |

OTHER PUBLICATIONS

IBM TDB, vol. 15, No. 1, Jun. 1972, p. 46, "Resist Process", Horst et al.

Basseous et al., IBM Technical Disclosure Bulletin, vol. 23, No. 7B, pp. 3387–3390, 12/1980.

King, M. C., IEEE Trans. on Electron Devices, Ed. 26, No. 4, 4/1979, pp. 711–716.

Griffin, B. F., J. Vac. Sci. Tech., 19(4), 11/1981, pp. 1423–1428.

*Primary Examiner*—Charles L. Bowers, Jr.
*Attorney, Agent, or Firm*—Henry Powers

[57] ABSTRACT

A resist system for semiconductor device fabrication comprised of bottom positive resist layer of a diazoquinone/novolak resist applied to a substrate and overcoated with a like or different diazoquinone/novolak top resist layer which has been sensitized with pyrene and/or its derivatives.

5 Claims, 13 Drawing Figures

DQN CONTROL
APERTURE 2 SLIT 1mm SS185
R/Ro~3  SA 44°
2.0 μm LINE  1.5 μm SPACE

THE BASIC CONTROL FOR EXPOSURE
DQN SINGLE LAYER PHOTORESIST 2.5° PYRENE + DQN
APERTURE 2 SLIT 1mm SS 360
R/Ro~10  SA 58°
1.5 μm SPACE  2.0 μm LINE

THE CONTROL EXPERIMENT OF SINGLE
LAYER 3% PYRENE DQN PHOTORESIST

3% PYRENE DQN/DQN
APERTURE 2 SLIT 1mm SS180
R/Ro >40  SA 64°
2.0 μm LINE  1.5 μm SPACE

DOUBLE LAYER PHOTORESIST WITH 3%
PYRENE + DQN AS TOP & DQN AS BOTTOM
LAYER. THE EXPOSURE DOSE IS HALF
OF REGULAR DOSE.

3% PYRENE DQN/DQN
APERTURE 2 SLIT 1mm SS360
R/Ro ~10  SA 64°
2.0 μm LINE  1.5 μm SPACE

DOUBLE LAYER PHOTORESIST WITH 3%
PYRENE + DQN AS TOP & DQN AS BOTTOM
LAYER. THE EXPOSURE DOSE IS ONE
QUARTER OF REGULAR DOSE.

DQN CONTROL
APERTURE 1 SLIT 1mm SS720
R/Ro ~2 SA 46°
1.5 LINE SPACE

CONTROL EQUIPMENT: DQN SINGLE LAYER EXPOSED
WITH APERATURE 1 SLIT 1mm
AND SCAN SPEED 720.

2.5% PYRENE DQN/DQN
APERTURE 1 SLIT 1mm SS720
R/Ro ~15 SA 68°
1.5 μm LINE SPACE

DOUBLE LAYER PHOTORESIST: 2.5% PYRENE
DQN TOP AND BOTTOM LAYER.

2.5% PYRENE DQN
APERATURE 1 SLIT 1mm SS720
R/Ro ~10 SA 64°
1.5 μm LINE SPACE

CONTROL EQUIPMENT: SINGLE
LAYER OF 2.5% PYRENE DQN 2.5% PYRENE DQN/DQN
APERATURE 1 SLIT 1mm SS600
2.0 μm LINE 1.5 μm SPACE
OVER 0.5 μm STEPS

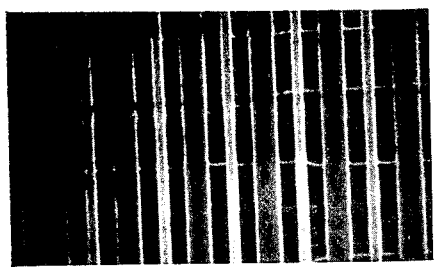

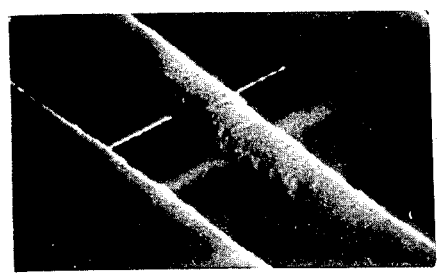

FIG. 12

DOUBLE LAYER PHOTORESIST WITH 3% PYRENE+DQN AS TOP AND DQN AS BOTTOM LAYER, THE EXPOSURE DOSE IS ABOUT ONE QUARTER OF REGULAR DOSE.

2.5% PYRENE DQN/DQN
APERATURE 1 SLIT 1mm SS600
1.5 μm LINE 1.0 μm SPACE
OVER 0.5 μm STEPS

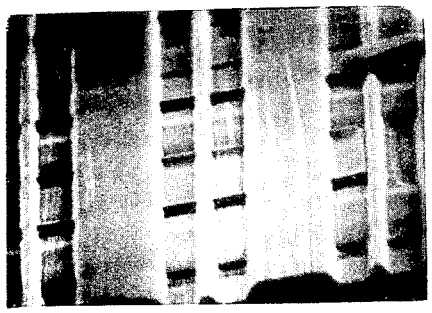

FIG. 13

DOUBLE LAYER PHOTORESIST WITH 3% PYRENE+DQN AS TOP AND DQN AS BOTTOM LAYER, THE EXPOSURE DOSE IS ABOUT ONE QUARTER OF REGULAR DOSE.

PROCESS FOR FORMING RESIST MASKS UTILIZING O-QUINONE DIAZIDE AND PYRENE

DESCRIPTION

TECHNICAL FIELD

This invention relates to photolithography, and more particularly to the fabrication of lithographic positive resist masks for the fabrication of semiconductor integrated circuit devices.

One object of the present invention is to provide a new and improved positive resist mask structure for the fabrication of semiconductor devices.

Another object of this invention is to provide a new and improved resist structure having an enhanced R/Ro ratio where R is the dissolution rate of the exposed resist portion in solvent and Ro is the dissolution rate of unexposed resist portions.

Another object of this invention is to provide a new and improved positive resist structure adapted for formation of via holes having improved sidewall profiles or angles.

Another object of this invention is to provide a new and improved positive resist structure having enhanced sensitivity to radiation.

A further object of this invention is to provide a new and improved positive resist structure with reduced exposure time and corresponding processing throughput.

BRIEF DESCRIPTION OF THE DRAWINGS

In the accompanying drawings forming a material part of this disclosure.

FIGS. 5 to 13 are comparative microphotographics for purposes of illustrating the invention of this application.

BACKGROUND ART

One positive resist system in use today for microlithography applications is comprised of an alkali soluble polymer, such as phenol or o-cresol formaldehyde novolak resin, and a diazoketone or quinone sensitizer or photoactive compound (PAC). Such sensitizers and resists are described, as for example, in U.S. Pat. Nos. 3,046,118; 3,046,121; 3,106,445; 3,201,239; 3,666,473; and 4,059,449. Exposure to radiation causes the exposed portions of the resist to become soluble in alkaline solutions in which the resist is normally developed. One method of image-wise exposing of the resist is commonly known as projection printing utilizing commercially available tools such as the Perkin-Elmer (P.E.) Projection Printer Model No. PE-300.

In order to achieve 1:1 projection lithography, a lower exposure wavelength (e.g. 240 nm~320 nm) is required, as contrasted with conventional wavelengths (e.g. 360 nm~400 nm), as discussed by M. C. King, IEEE Tran. Elec. Devices, 26 711 (1979). A preferred resist for this application is this resist, herein referred to "DQN" is comprised of an o-cresol formaldehyde novolak and diazoquinone PAC which is 2,4-bis(6-diazo-5,6-dihydro-5-oxo-1-naphthalenesulfonyl-oxy) benzophenone, which may be admixed with corresponding monoester and triester by products.

Because of the deep UV wavelengths limit of exposure sources (PE-300-UV3) and the high absorption of these resists (e.g. resin and DQN) below 300 nm, the exposure range 300–330 nm (mid-UV) is projected as being the preferred range of the coming future. The extinction coefficient, $\epsilon$, of PAC photoresist in the indicated DQN resist in the current exposure range (360 nm~400 nm) is about $6\times10^3$ M$^{-1}$ cm$^{-1}$ per diazoquinone unit. At 313 nm, which is the major output of mercury lamps in the mid-UV range, the $\epsilon$ of the PAC is just $2.5\times10^3$ M$^{-1}$ cm$^{-1}$ per diazoquinone unit (DQ). Because of the lower $\epsilon$ of the PAC, and lower lamp intensity at 313 nm, compared with those of 360 nm, the wafer throughput (in device fabrication) exposed at 313 nm will be half or less of that of the current exposure tools.

It has been proposed to improve the lower throughput by the addition of sensitizers, as in U.S. Pat. Nos. 4,009,033 and 4,059,499, which absorb more incident dose and transfer energy to the PAC. The PAC then undergoes the direct path to the alkaline soluble product.

Figure 1:
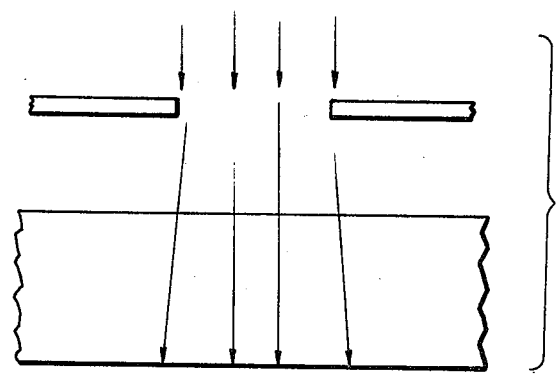
FIGS. 1 to 4 are explanatory schematic drawings for the background art.
Figure 2:
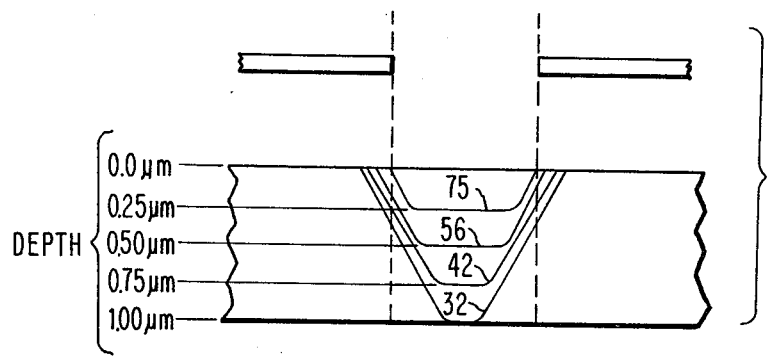

Also, because of the nature of diffraction of incident radiation in the projection mode, the photons do not pass through the resist in parallel manner. This phenomena is illustrated in FIG. 1. Because of the photon diffraction and their absorption in the photoresist, the available photon energy is not distributed homogeneously in the photoresist. FIG. 2 illustrates a quantitative depiction of photon density in a 1 μm photoresist layer with a via hole of optical density of 0.5, where the numbers 75, 56, 42 and 32 represent the percentage of incident dose.

Figure 3:
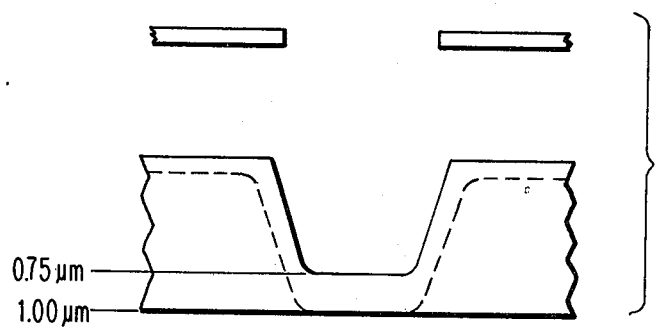

It is known that the quantity of energy dose determines the degree of decomposition of positive resist. Consequently the decomposition of the resist determines the dissolution rate of the exposed resist. As a result, the region from the 0.75 μm depth to the 1.00 μm depth is the most difficult to be developed. This is the reason that a surface image can be easily obtained. This is illustrated in FIG. 3, where the solid and dotted lines represent the image shape if the development is stopped at the 0.75 μm depth and 1.00 μm depth, respectively. In the dissolution from the 0.75 μm to 1.0 μm depth, an isotropic loss of material occurs resulting in an undesirable image and loss (Ro) of unexposed resist.

Figure 4:
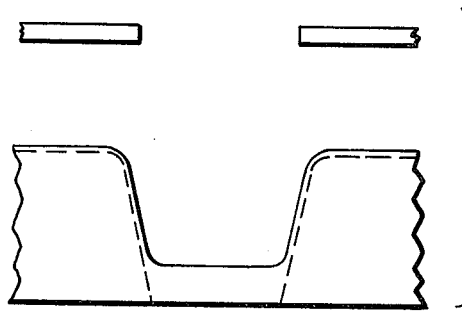
Figure 5:
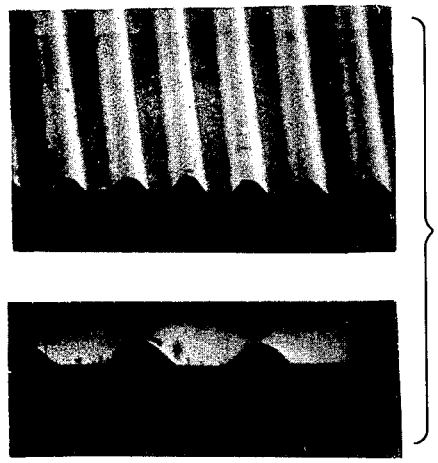
Figure 6:
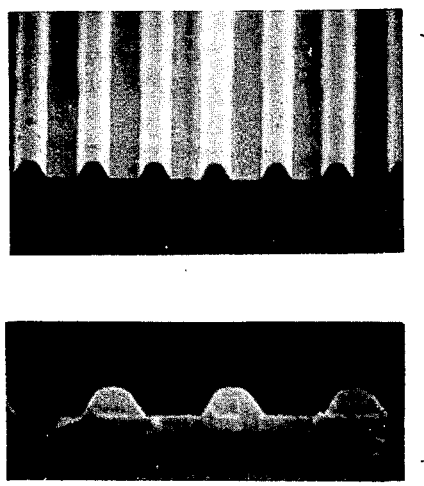
Figure 7:
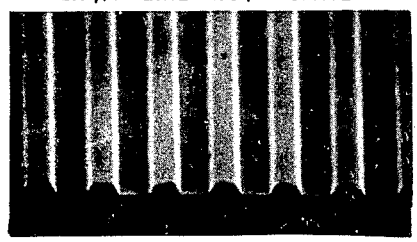
Figure 7:
Figure 8:
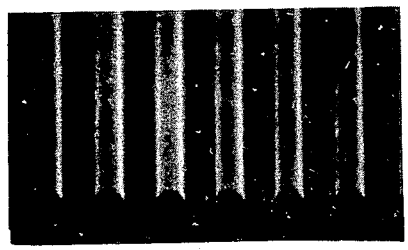
Figure 8:
Figure 9:
Figure 9:
Figure 10:
Figure 10:
Figure 11:
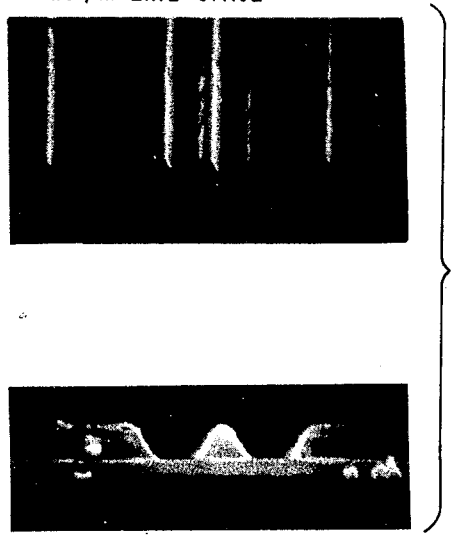

Instead of the shape of the dotted line in FIG. 3, it is desirable that the shape of the image would proceed anisotropically from the solid line profile to the dotted line profile of FIG. 4, as the development is continued. In this manner the value of R/Ro and sidewall angle could be increased sharply.

In order to achieve the different dissolution rates in vertical but not in horizontal directions, a composite combination of a pre-exposed bottom resist layer overcoated with a top layer has been proposed, as for example, see U.S. Pat. No. 3,873,313. However, several difficulties must be considered, among which is that the incorporation of an exposed bottom resist layer under the top resist layer can increase the dissolution rate of unexposed area (Ro). Because the top resist layer of such composites, serves as a pattern layer in the development, the higher Ro will give a lower undesired R/Ro ratio.

DISCLOSURE OF THE INVENTION

For further comprehension of the invention, and of the objects and advantages thereof, reference will be had to the following description and accompanying drawings and to the appended claims in which the novel features of the invention are more particularly set forth.

In accordance with this invention, a process is defined for forming a composite resist mask on a substrate (e.g. in semiconductor device fabrication) comprising the steps of forming a first bottom layer of a blanket exposed positive resist on the substrate, and overcoating the bottom resist layer with a top layer of an unexposed positive resist layer containing an aromatic sensitizer such as pyrene or its derivative, such as methyl pyrene. Conventionally the top resist overcoating can be of the same composition as the bottom exposed resist layer, and optionally both being the preferred DQN resist identified above. In this manner the DQ resist can be used as the bottom exposed layer and the same DQN resist with the added sensitizer as the top layer. As indicated pyrene and its derivatives (e.g. methyl pyrene) have been preferred, and can be added to the DQ resist in a range of 1 to 10 wt. % and preferably from about 2 to about 4 wt. %, based on the resist solids content. The DQN/DQN-pyrene composite mask was found to significantly reduce the Ro of the mask.

After application of the composite mask, it is then image-wise exposed in a desired pattern, baked to improve adhesion and/or development, and employed for processing operations of semiconductor operations, after which the resist mask can be stripped from the substrate by exposure to an alkaline solvent.

The top and bottom resist layers can be selected from commercially available diazoquinone/novolak positive resists, such as the AZ-1350 type resist of the Shipley Company.

Examples of positive photoresists which become more soluble upon exposure to radiation are the diazoquinone/novolak resins such as are described, for example, in U.S. Pat. Nos. 3,201,239 and 3,666,473. The resists are applied to substrates from solvent mixtures using conventional techniques such as spraying, flowing, roller coating, spinning and dip coating after which the solvent is removed by evaporation, which is sometimes aided by low temperature baking, to leave a layer of resist on the surface of the substrate.

In the process of the invention, a first layer of photoresist is coated onto the substrate to be processed in a conventional manner. The entire resist layer is then flooded with a sufficient dose of radiation so that the photosensitive material is substantially all reacted, i.e., blanket exposed. The photoresist layer is then baked at a relatively high temperature to provide improved adhesion of the layer to the substrate surface. The baking temperatures conventionally employed to obtain improved adhesion are usually at least about 140° C. The optimum exposure times and baking times and temperatures for each photoresist can be easily determined by one skilled in the art.

The preexposure of the bottom layer resist can be performed in two ways. First, the resist can be exposed in solution before coating on the substrate, or it can be coated first on the substrate and then exposed. The latter method was employed here, as noted above.

As indicated above, a preferred diazoquinone/novolak resist (DQN) comprises an o-cresol formaldehyde novolak formulated with a PAC comprised of 2,4,bis(6-diazo-5,6-dihydro-5-oxo-1-naphthalenesulfonyloxy) benzophenone which has the structure

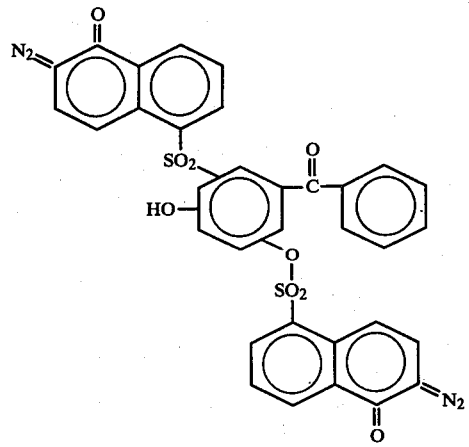

in admixture with corresponding monoester and triester by products, wherein the resist:

A second layer of a pyrene sensitized positive resist (which is preferably the same DQN resist, but which also can be a different resist as the bottom resist layer) is then blanket coated over the bottom resist layer. The sensitized top resist layer can be easily formed, as for example, by adding pyrene and/or its derivatives (e.g. methyl pyrene) to the diazoquinone/novolak resists.

Since the photodecomposition of photoactive compounds (PAC), the electronic excited singlet state, these sensitizers meet the following effective requirements: $\epsilon \geq 1 \times 10^4$ M$^{-1}$ cm$^{-1}$ at 313 nm; extreme long singlet state lifetimes; high singlet state energy ($\geq 58$K cal/mole); and no interference with the photodecomposition of the DQ units. The $\epsilon$, lifetime and energy of pyrene are $1 \times 10^4 \mu^{-1}$ cm$^{-1}$, 300 ns, and 75K cal Mol$^{-1}$, respectively.

The addition of these pyrene sensitizers to DQN slows the dissolution rate of R and Ro (R=exposed resist dissolution rate, Ro=unexposed resist dissolution rate). However, the lower dissolution does have advantages in terms of R/Ro. A simplified illustration is presented as follows: if R = 10 Å/sec and Ro = 2 Å/sec in the absence of the sensitizer additive, the R/Ro = 5, however if the sensitizer additive can reduce the R and Ro by one unit, then R/Ro would be 9. Although the concept has been simplified, it should be kept in mind with respective to the additive enhancement of the diazoquinone/novolak type positive resists.

In general, the thickness of the bottom resist layer can be from about 0.5 to about 2.0 μm, and the sensitized top resist layer thickness can be in the range of about 0.4 to about 1.0 μm.

DESCRIPTION OF PREFERRED EMBODIMENTS

Thermally oxidized silicon semiconductor substrates, having about 7000 Å thick oxide layer were coated with layers of positive resist having the thicknesses indicated in the Tables below by spin coating at a rate of 4700 rpm. The resists employed were the indicated preferred DQN resists in a 30 wt. % content solution of 80 Wt. % 2-ethoxyethyl acetate, 10 wt. % n-butyl acetate and 10 wt. % xylene. A portion of these resist coated substrates were retained as controls. An additional number of the resist coated substrates were blanket exposed and then overcoated with a second DQN resist containing pyrene additive sensitizer in the weight percentages indicated in the Tables below. The sensitized DQN resist was coated with a spin rate of about 4300 rpm as the top layer with a final prebake temperature of about $1.0\pm0.1$ μm. The wafers were then exposed in the P-E tool with UV-3 with instrument setting: Aperture (A) 1 or 2, slit 1 mm and scan speed (SS) indicated in the Tables. All substrates were pre-baked for 30 minutes at 85° C. on a hotplate. Additional control samples were prepared by overcoating the remaining DQN exposed substrate with the same but unexposed DQN resist.

To obtain a further control, a pyrene sensitized DQN resist was coated directly as a single layer on oxide surface of the semiconductor substrate or wafer, with the indicated prebaking, as indicated in the Tables below.

All substrates were then image-wise exposed in a desired pattern through a test pattern mask, and developed in a conventional alkaline developer.

The results are summarized in the following Table I.

top and bottom resist layer. However, the results show that the double DQN resist layer do not provide better performance as compared with the DQN single resist layer system. The results show that the pyrene addition in the top DQN resist layer is definitely required to make the dissolution rate change dramatically as the development reaches the bottom DQN resist layer.

The addition of pyrene in the top DQN layer (DQN-pyrene) is a unique approach. Pyrene serves as a sensitizer to enhance the sensitivity of the diazoquinone/novolak positive resists (e.g. DQN) 4 times, and reduce the dissolution rate of the top resist layer which provides a good pattern mask to develop the bottom resist layer.

Also, the double layer resist system of this invention provides an excellent resolution of 1.5 μm line-spaced combination, R/Ro about 15, and sidewall angle of about 70°, as well as the highest sensitivity ever reported for such resists at mid-UV regions (4 to about 5 times that of DQN).

The system requires only one extra process step, with

TABLE I

| Sample | Exposure Time | Scan Speed | A | Relative Dose[1] | Dev. Time (1:3.5) | Loss of Thick. (R/Ro) 1.5μ Space, 2.0μ Line | Sidewall Angle | Dose[4] of Bottom Layer | FIG. |
|---|---|---|---|---|---|---|---|---|---|
| DQN | 36" | 180 | 2 | ½ | 48" | 32% (3) | 44° | — | 5 |
| DQN[3] 3% Pyrene | 36" | 180 | 2 | ½ | 300" | 18% (6) | 58° | — | 6 |
| DQN + 3% Pyrene over DQN | 36" | 180 | 2 | ½ | 133" | <1% (>40) | 63° | 80 | |
| | 36" | 180 | 2 | ½ | 150" | 2% (40) | 64° | 56 | 7 |
| | 18" | 360 | 2 | ½ | 460" | 10% (10) | 64° | 56 | 8 |
| DQN over DQN | 36" | 180 | 2 | ½ | 55" | >40% | | 64 | |

[1]The dose is compared with that at aperture 1. Slit 1 mm and scan speed 180. All exposures.
[2]A = Aperture
[3]Stock solution is 8% pyrene - DQN. Proper solution was obtained by dilution with DQN.
[4]Relative value.

Compared with the control 3 wt. %/DQN, the double layer system of this invention can reduce the development time from 330" to 150", and increase the R/Ro and sidewall angle from 6 to 40 and 58° to 64°, respectively. FIGS. 5, 6, 7 and 8 demonstrate the significant improvement of the double layer system compared with the controls.

As far as the throughput is concerned, additional samples were exposed on the P.E. unit at aperture=1, slit 1 mm and scan speed of 720, which is four times faster than that recommended for Shipley's AZ-2400 resist. The results are summarized in the following Table II, and demonstrated that the double layer system of this invention can provide a 4X throughput with R/Ro=15, sidewall angle=68° at 1.5 μm line space combination.

respect to the bottom resist layer. Here, the blank exposure of the bottom resist layer can be carried in solution prior to coating applications on the substrate. In fact there is indication that the blank exposure could be omitted, since the lowest limit of blank exposure has not been found.

The development process is exactly the same as that for diazoquinone/novolak resists using Shipley's commercial AZ-2401 developer. Also, the system provides a convenient development time, 3 to about 4 minutes, which has a wider process window for handling, relative to development times of less than one minute for other resists.

Since the bottom resist layer serves as a make-up layer, the sensitized top resist layer can be made thin enough to achieve the highest sensitivity, and have the

TABLE II

| Sample | Exposure Time | Scan Speed | A | Relative Dose | Dev. Time (1:3.5) | Loss of Thick. (R/Ro) 1.5 μm Line-Space | Sidewall Angle | Dose of Bottom Layer | FIG. |
|---|---|---|---|---|---|---|---|---|---|
| DQN | 10" | 720 | 1 | ½ | 130" | 50% (2) | 46° | — | 9 |
| DQN + 2.5% Pyrene Over DQN | 10" | 720 | 1 | ½ | 240" | 7% (15) | 68° | 50 | 10 |
| DQN + 2.5% Pyrene | 10" | 720 | 1 | ½ | 580" | 10% (10) | 64° | — | 11 |

As shown in Table II, the present invention provides a consistent, simple double layer mid-UV photoresist having a throughput increase of 4X with better performance, R/Ro=15, sidewall angle=68° C. at 1.5μ line-spaced combination. As seen a control experiment has been carried out where the DQN resist was used as the total composite film thickness up to $1.0\pm\mu m$ (the thinner the top resist layer is, the better the pyrene is as a sensitizer, and the higher the sensitivity of the pyrene sensitized resist). Also, since the bottom layer planarizes surface topography, images produced in the composite, provide undistorted patterns over steps, FIGS. 12 and 13. The exposure tool does not have to be confined to a reflective optical system such as the Perkin Elmer UV-3, but is envisioned to perform as well on refractive optical steppers, proximity printers, or contact printers.

While the invention has been illustrated and described with preferred embodiments of this invention, it is to be understood that the invention is not to be limited to the precise construction herein disclosed and the right is reserved to all changes and modifications coming within the scope of the invention as defined in the appended claims.

Having thus described the invention, what is claimed as new, and desired to be secured by by Letters Patent is:

1. A process for forming a positive resist mask on a substrate comprising:
    A. forming on said substrate a first layer of essentially a novolak and o-quinonediazide containing positive resist which has been blanket exposed to substantially desensitize it;
    B. blanket coating said first layer with a non-exposed second layer of a novolak and o-quinonediazide resist containing pyrene which comprises from about 1 to about 10 wt. % of said second resist layer;
    C. imagewise exposing said second resist layer; and
    D. developing a relief image in both said resist layers by removal thereof under said image-exposed portions.

2. The process of claim 1 wherein said novolak comprises o-cresol formaldehyde, and said diazide comprises 2,4-bis(6-diazo-5,6-dihydro-5-oxo-1-naphthalenesulfonyloxy)benzophenone.

3. The process of claim 1 including a bake step at about 70° to 100° C. between said image exposure and said developing steps.

4. The process of claim 3 wherein said novolak comprises o-cresol formaldehyde, and said diazide comprises 2,4-bis(6-diazo-5,6-dihydro-5-oxo-1-naphthalenesulfonyloxy)benzophenone.

5. The process of claim 1, 3 or 4 wherein pyrene comprises 2 to 4 wt. % of said resist.

* * * * *